United States Patent
Halperin

(10) Patent No.: US 11,327,130 B2
(45) Date of Patent: May 10, 2022

(54) RF SAFE TRANSMISSION LINE FOR MRI

(71) Applicant: THE JOHNS HOPKINS UNIVERSITY, Baltimore, MD (US)

(72) Inventor: Henry R. Halperin, Baltimore, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 16/301,033

(22) PCT Filed: May 16, 2017

(86) PCT No.: PCT/US2017/032838
§ 371 (c)(1),
(2) Date: Nov. 13, 2018

(87) PCT Pub. No.: WO2017/201000
PCT Pub. Date: Nov. 23, 2017

(65) Prior Publication Data
US 2019/0178960 A1    Jun. 13, 2019

Related U.S. Application Data

(60) Provisional application No. 62/336,800, filed on May 16, 2016.

(51) Int. Cl.
*G01R 33/36* (2006.01)
*G01R 33/28* (2006.01)

(52) U.S. Cl.
CPC ....... *G01R 33/3685* (2013.01); *G01R 33/287* (2013.01); *G01R 33/288* (2013.01)

(58) Field of Classification Search
CPC . G01R 33/3685; G01R 33/287; G01R 33/288
See application file for complete search history.

(56) References Cited

U.S. PATENT DOCUMENTS 5,964,705 A * 10/1999 Truwit ............... A61B 5/055
                                                 324/318
8,228,065 B2    7/2012 Wirtz et al.
(Continued)

FOREIGN PATENT DOCUMENTS

WO    2006003566 A1    1/2006
WO    2011033456 A1    3/2011
(Continued)

OTHER PUBLICATIONS

Dumoulin, et al., Real-time position monitoring of invasive devices using magnetic resonance. Magn Reson Med. Mar. 1993;29(3):411-5.
(Continued)

*Primary Examiner* — Akm Zakaria
(74) *Attorney, Agent, or Firm* — Johns Hopkins Technology Ventures

(57) ABSTRACT

An embodiment in accordance with the present invention provides an improved electrically conductive transmission line that is radio frequency (RF) safe. The present invention does not include any inductive coupling elements. Instead, multiple coils constructed from twisted pairs of wires are used to block the common mode of the received magnetic resonance (MR) signal that can cause heating, while passing the differential mode that is used for tracking and/or imaging. These twisted pair coils are easily manufactured out of a single length of twisted pair wire, but multiple segments could also be used. The twisted pair coils of the present invention are easier to manufacture than the pre-existing inductive coupling element-based transmission lines, and occupy less overall volume inside a medical device. The individual coils of twisted pairs are tuned to the resonant frequency of the MR scanner by the addition of appropriate capacitors.

21 Claims, 2 Drawing Sheets

(56) References Cited

U.S. PATENT DOCUMENTS

| | | | |
|---|---|---|---|
| 8,369,964 B2 | 2/2013 | Ameri | |
| 8,643,372 B2 | 2/2014 | Weiss | |
| 2002/0013525 A1* | 1/2002 | Scott | G01R 33/285 |
| | | | 600/410 |
| 2009/0251236 A1* | 10/2009 | Gleich | G01R 33/3685 |
| | | | 333/24 R |
| 2010/0023000 A1* | 1/2010 | Stevenson | A61B 18/1492 |
| | | | 606/33 |
| 2012/0130224 A1 | 5/2012 | Consiglio et al. | |

FOREIGN PATENT DOCUMENTS

| | | | | |
|---|---|---|---|---|
| WO | 2015150507 A1 | 10/2015 | | |
| WO | WO 2015/150507 | * 10/2015 | | G01R 33/36 |

OTHER PUBLICATIONS

Ladd, et al., RF heating of actively visualized catheters and guidewires. 1998. Proceedings of the ISMRM, 6th Scientific Meeting and Exhibition, Sydney, p. 473.

Konings, et al., Heating around intravascular guidewires by resonating RF waves. J Magn Reson Imaging. Jul. 2000;12(1):79-85.

Nitz, et al., On the heating of linear conductive structures as guide wires and catheters in interventional MRI. J Magn Reson Imaging. Jan. 2001;13(1):105-14.

Weiss, et al., Transmission line for improved RF safety of interventional devices. Magn Reson Med. Jul. 2005;54(1):182-9.

Vernickel, et al., A safe transmission line for MRI. IEEE Trans Biomed Eng. Jun. 2005;52(6):1094-102.

* cited by examiner

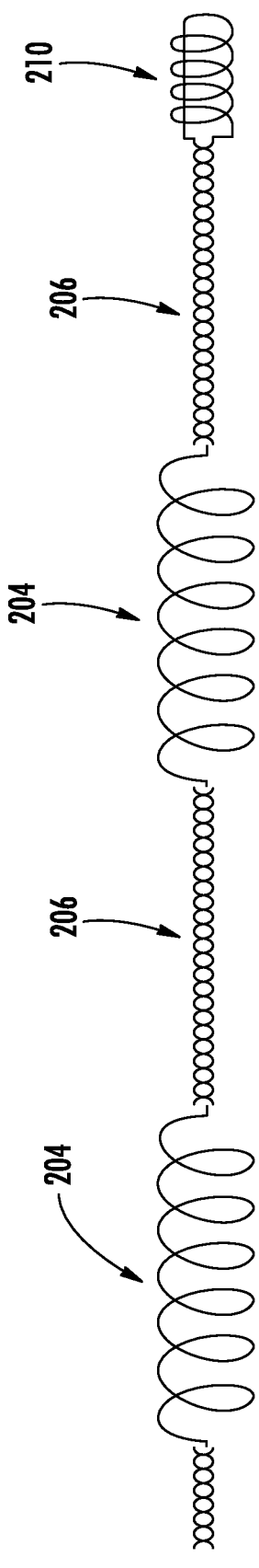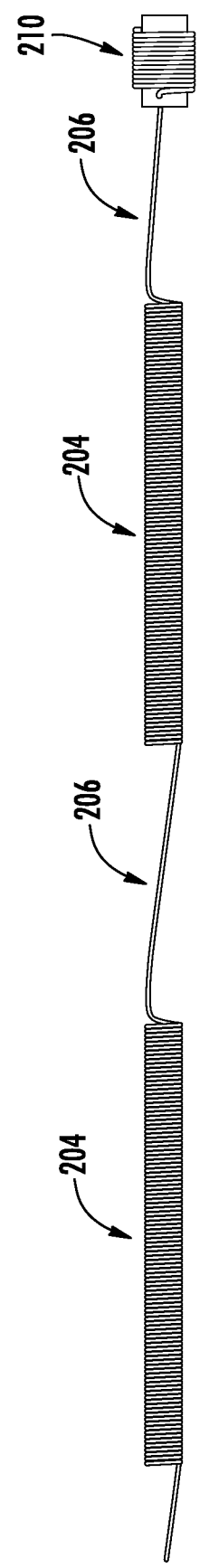

RF SAFE TRANSMISSION LINE FOR MRI

CROSS-REFERENCE TO RELATED APPLICATIONS

This application is a 35 U.S.C. § 371 U.S. national entry of International Application PCT/US2017/032838, having an international filing date of May 16, 2017, which claims the benefit of U.S. Provisional Application No. 62/336,800, filed May 16, 2016, the content of each of the aforementioned applications is herein incorporated by reference in their entirety.

GOVERNMENT RIGHTS

This invention was made with government support under HL094610 awarded by the National Institutes of Health. The government has certain rights in the invention.

FIELD OF THE INVENTION

The present invention relates generally to medical devices. More particularly, the present invention relates to an RF safe transmission line for magnetic resonance imaging (MRI).

BACKGROUND OF THE INVENTION

A wide range of techniques have been proposed to track the position of interventional instruments in magnetic resonance. Among these, active tracking with device-borne miniature receive coils have proven to be very fast and comfortable with almost any imaging sequence. Also, interventional instruments with local imaging coils have been used for intravascular imaging. However, many of the devices currently available, as illustrated in prior art FIGS. 1-3, include inductive coupling elements. Such inductive elements can be difficult to manufacture and can take up considerable volume in an interventional device.

Therefore, it would be advantageous to provide an improved electrically conductive transmission line that is radio frequency (RF) safe, but that does not include any inductive coupling elements.

SUMMARY OF THE INVENTION

The foregoing needs are met, to a great extent, by the present invention, wherein in one aspect an electrically conductive transmission line configured for use in a magnet bore of a magnetic resonance system includes a structure that conducts radiofrequency (RF) energy. The device also includes at least one coil formed from an uninterrupted segment of the conductive structure.

In accordance with an aspect of the present invention, the structure that conducts RF energy structure is one of a twisted pair of wires, a coaxial cable, a pair of parallel wires, and a pair of wires. A shield can be configured to encase the at least one coil, only a part of the at least one coil, or part of the connection to the at least one coil.

In accordance with an aspect of the present invention, an invasive medical instrument includes a magnetic resonance coil used for tracking or imaging and a transmission line. The transmission line includes a structure that conducts radiofrequency (RF) energy at least one coil formed from an uninterrupted segment of the conductive structure. The instrument can take the form of a catheter.

In accordance with another aspect of the present invention, an electrically conductive transmission line configured for use in the magnet bore of a magnetic resonance system includes a structure that conducts radiofrequency (RF) energy. The device includes at least one coil formed from an uninterrupted segment of the conductive structure. The at least one coil is encased in a shield, wherein the shield includes a foil wrapped around the at least one coil. The shield includes a coaxial tube encasing the at least one coil.

In accordance with yet another aspect of the present invention, an electrically conductive transmission line configured for use in a magnet bore of a magnetic resonance system, the electrically conductive transmission line includes a structure that conducts radiofrequency (RF) energy. The device includes at least one coil formed from a plurality of segments of the conductive structure that are coupled non-inductively.

In accordance with still another aspect of the present invention, an electrically conductive transmission line configured for use in a magnet bore of a magnetic resonance system includes a structure that conducts radiofrequency (RF) energy. The device also includes at least one coil formed from an uninterrupted segment of the conductive structure, said coil functioning to suppress some or all of the common mode RF energy.

In accordance with another aspect of the present invention, the structure takes the form of a twisted pair of wires, a coaxial cable, a pair of parallel wires, or a pair of wires. A shield encases the at least one coil, only a part of the at least one coil, or part of the connection to the at least one coil.

BRIEF DESCRIPTION OF THE DRAWINGS

The accompanying drawings provide visual representations, which will be used to more fully describe the representative embodiments disclosed herein and can be used by those skilled in the art to better understand them and their inherent advantages. In these drawings, like reference numerals identify corresponding elements and:

FIG. 4 is a schematic diagram illustrating a transmission line, in accordance with an embodiment of the present invention, connected to a miniature receiver coil at a device tip, wherein a plurality of coils are formed from a twisted wire pair and the twisted wire pair is connected to a miniature receiver coil.

FIG. 5 is a schematic illustrating a geometric layout of a transmission line, in accordance with an embodiment of the present invention, connected to a miniature receiver coil.

DETAILED DESCRIPTION

Figure 1:
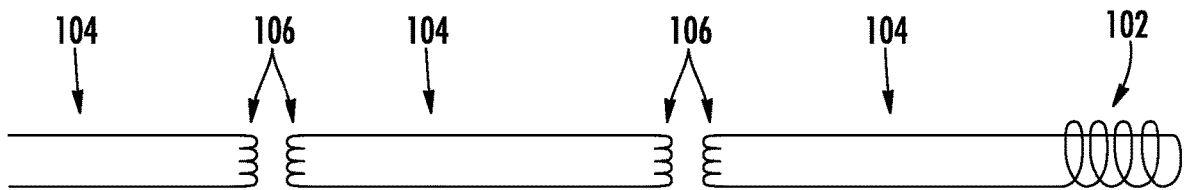
FIG. 1 is a schematic diagram illustrating a prior art electrically conductive transmission line, that incorporates inductive coupling elements.
Figure 2:
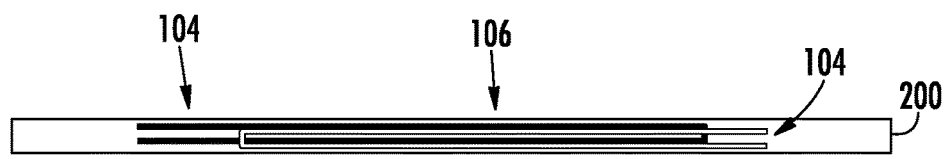
FIG. 2 is a schematic diagram illustrating a geometry of an inductive coupling element of a prior art transmission line.
Figure 3:
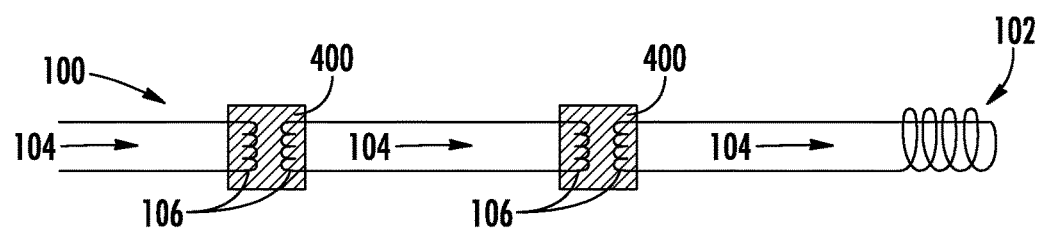
FIG. 3 is a schematic diagram illustrating a prior art transformer line connected to a miniature receiver coil at a device tip, wherein the transformer line comprises paramagnetic and/or ferromagnetic particles at the area of the coupling element.

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

An embodiment in accordance with the present invention provides an improved electrically conductive transmission line that is radio frequency (RF) safe. The present invention does not include any inductive coupling elements. Instead, multiple coils constructed from twisted pairs of wires are used to block the common mode of the received magnetic resonance (MR) signal that can cause heating, while passing the differential mode that is used for tracking and/or imaging. These twisted pair coils are easily manufactured out of a single length of twisted pair wire, but multiple segments could also be used. The twisted pair coils of the present invention are easier to manufacture than the pre-existing inductive coupling element-based transmission lines, and occupy less overall volume inside a medical device. The individual coils of twisted pairs are tuned to the resonant frequency of the MR scanner by the addition of appropriate capacitors.

In one embodiment of the present invention, multiple coils of twisted pairs of wire can be wound around a tube, for example the irrigation tube of an irrigated ablation catheter. The gauge of the wire used for the twisted pair, the composition of the wire, as well as the number of twists per unit length can be varied, for example, to change the impedance of the transmission line. In addition, the number of turns of twisted pair wire that are used to construct the coil, as well as the number of coils, can be varied.

The transmission lines of the present invention can be incorporated into various medical devices that can be used inside a magnetic resonance imaging (MRI) scanner. These medical devices can include various types of catheters that can be used for diagnosis and/or intervention. These transmission lines can be connected to one or more miniature tracking coils to allow for determining of the location of a medical device inside an MRI scanner and/or for imaging. The tracking coils can be, for example, a coil of wire or a pattern etched on a printed circuit board. The performance of the tracking coils may be enhanced by incorporating other circuit elements, for example, a parallel capacitor for tuning to the resonant frequency of the MRI scanner, and/or a series capacitor for matching the impedance of the tracking coil/parallel capacitor combination to the twisted pair.

In other embodiments, the transmission line of the present invention can have any type of impedance matching element on one or both ends to improve signal transmission efficiency.

In other embodiments, different types of conductive elements that transmit RF energy can be used instead of the twisted pairs of wire, for example, coaxial cable, parallel wires, resistance wires, and combinations of these and other conductive elements.

In yet other embodiments, shield(s) can be placed over parts of the transmission line, including a single coil, individual multiple coils, groups of multiple coils, segments of transmission line without coils, or combinations thereof. These shields can consist of materials with various electrical properties, for example, high conductivity such as copper, as well as materials with various magnetic properties, for example, paramagnetic, diamagnetic, and/or ferromagnetic.

FIG. 4 is a schematic illustrating a transmission line in accordance with an embodiment of the present invention, connected to a miniature receiver coil 210, wherein a single coil or a plurality of coils 204 are formed from a twisted wire pair 206, and the twisted wire pair is connected to a miniature receiver coil 210. The twisted pair of wires is only one type of structure that can conduct radiofrequency (RF) energy. Other types of RF conducting structures include coaxial cable, parallel wires, and well as two wires without any fixed geometrical relationship. The type of structure used could be based on the desired efficiency of conduction of specific radio frequencies, amount of radiation allowed, as well as other types of losses. In all cases, however, the RF conducting structure is formed into one or more coils. The conducting structure could be continuous for all of the turns of a coil, without any breaks such as for inductive coupling segments. In other embodiments, segments of the conducting structure, used for constructing the coils and/or for the connections between coils, could be coupled non-inductively by components such as capacitors and/or resistors. Capacitive coupling of segments could be used, for example, for isolation.

FIG. 5 is a schematic illustrating a geometric layout of a transmission line, in accordance with an embodiment of the present invention, connected to a miniature receiver coil 210, wherein a single coil or a plurality of coils 204 are formed from a twisted wire pair 206, and the twisted wire pair is connected to a miniature receiver coil 210. The illustrated embodiment shows two coils 204 of twisted pair wire connected in series by segments of twisted pair wire 206 that are not formed into coils. In still other embodiments the segments of twisted pair wire 206 that connect to the coils 204 could be coils that have a different pitch than the coils 204. For example, there may be 70 turns of twisted pair wire that constitute one coil 204, where the distance between the turns (pitch) is 0.005 inches. The segment of twisted pair wire 206 that connects to one or two coils may itself be a coil but with a pitch, for example, of 1 inch, where 3 turns of the twisted pair would be used to connect one or more of the coils 204 that are, for example, three inches apart. A shield can be used to cover all or a part of the coil.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An electrically conductive transmission line configured for use in a magnet bore of a magnetic resonance system, the electrically conductive transmission line comprising:
   a structure that conducts radiofrequency (RF) energy without any inductive coupling elements; and
   at least one helically wound coil formed from an uninterrupted segment of the structure that conducts RF energy, wherein the at least one helically wound coil is configured to block a common mode of a received magnetic resonance signal, while the at least one helically wound coil allows a differential mode of the received magnetic resonance signal to pass.

2. The electrically conductive transmission line of claim 1, wherein the structure that conducts RF energy is a twisted pair of wires.

3. The electrically conductive transmission line of claim 1, wherein the structure that conducts RF energy is a coaxial cable.

4. The electrically conductive transmission line of claim 1, wherein the structure that conducts RF energy is a pair of parallel wires.

5. The electrically conductive transmission line of claim 1, wherein the structure that conducts RF energy is a pair of wires.

6. The electrically conductive transmission line of claim 1 further comprising a shield that encases the at least one helically wound coil.

7. The electrically conductive transmission line of claim 1 further comprising a shield that encases only a part of the at least one coil.

8. The electrically conductive transmission line of claim 1 further comprising a shield that encases part of the connection to the at least one coil.

9. An invasive medical instrument comprising:
   a magnetic resonance coil used for tracking or imaging;
   a transmission line, wherein the transmission line comprises a structure that conducts radiofrequency (RF) energy without any inductive coupling elements; and
   at least one helically wound coil formed from an uninterrupted segment of the structure that conducts RF energy, wherein the at least one helically wound coil is configured to block a common mode of a received magnetic resonance signal, while the at least one helically wound coil allows a differential mode of the received magnetic resonance signal to pass.

10. The instrument of claim 9, wherein the instrument is a catheter.

11. An electrically conductive transmission line configured for use in a magnet bore of a magnetic resonance system, the electrically conductive transmission line comprising:
    a structure that conducts radiofrequency (RF) energy without any inductive coupling elements; and
    at least one helically wound coil formed from an uninterrupted segment of the structure that conducts RF energy, wherein the at least one helically wound coil is encased in a shield, and wherein the shield comprises a foil wrapped around the at least one helically wound coil, and wherein the at least one helically wound coil is configured to block a common mode of a received magnetic resonance signal, while the at least one helically wound coil allows a differential mode of the received magnetic resonance signal to pass.

12. The electrically conductive transmission line of claim 11, wherein the shield comprises a coaxial tube encasing the at least one helically wound coil.

13. An electrically conductive transmission line configured for use in a magnet bore of a magnetic resonance system, the electrically conductive transmission line comprising:
    a structure that conducts radiofrequency (RF) energy without any inductive coupling elements; and
    at least one helically wound coil formed from a plurality of segments of the structure that conducts RF energy that are coupled non-inductively, wherein the at least one helically wound coil is configured to block a common mode of a received magnetic resonance signal, while the at least one helically wound coil allows a differential mode of the received magnetic resonance signal to pass.

14. An electrically conductive transmission line configured for use in a magnet bore of a magnetic resonance system, the electrically conductive transmission line comprising:
    a structure that conducts radiofrequency (RF) energy without any inductive coupling elements; and
    at least one helically wound coil formed from an uninterrupted segment of the structure that conducts RF energy, said at least one helically wound coil functioning to suppresses some or all of the common mode RF energy, wherein the at least one helically wound coil is configured to block a common mode of a received magnetic resonance signal, while the at least one helically wound coil allows a differential mode of the received magnetic resonance signal to pass.

15. The electrically conductive transmission line of claim 14, wherein the structure that conducts RF energy is a twisted pair of wires.

16. The electrically conductive transmission line of claim 14, wherein the structure that conducts RF energy is a coaxial cable.

17. The electrically conductive transmission line of claim 14, wherein the structure that conducts RF energy is a pair of parallel wires.

18. The electrically conductive transmission line of claim 14, wherein the structure that conducts RF energy is a pair of wires.

19. The electrically conductive transmission line of claim 14, further comprising a shield that encases the at least one helically wound coil.

20. The electrically conductive transmission line of claim 14, further comprising a shield that encases only a part of the at least one helically wound coil.

21. The electrically conductive transmission line of claim 14, further comprising a shield that encases part of the connection to the at least one helically wound coil.

* * * * *